(12) United States Patent
Chen et al.

(10) Patent No.: US 9,245,972 B2
(45) Date of Patent: Jan. 26, 2016

(54) METHOD FOR MANUFACTURING SEMICONDUCTOR DEVICE

(71) Applicant: UNITED MICROELECTRONICS CORP., Hsinchu (TW)

(72) Inventors: Shin-Chi Chen, Penghu County (TW); Chih-Yueh Li, Taipei (TW); Shui-Yen Lu, Hsinchu County (TW); Yuan-Chi Pai, Tainan (TW); Fong-Lung Chuang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 130 days.

(21) Appl. No.: 14/016,393

(22) Filed: Sep. 3, 2013

(65) Prior Publication Data

US 2015/0064861 A1    Mar. 5, 2015

(51) Int. Cl.
*H01L 29/66* (2006.01)
*H01L 21/8234* (2006.01)

(52) U.S. Cl.
CPC .. *H01L 29/66484* (2013.01); *H01L 21/823412* (2013.01); *H01L 21/823418* (2013.01); *H01L 29/66477* (2013.01)

(58) Field of Classification Search
None
See application file for complete search history.

(56) References Cited

U.S. PATENT DOCUMENTS

| | | | |
|---|---|---|---|
| 5,892,282 A | 4/1999 | Hong | |
| 6,096,659 A | 8/2000 | Gardner | |
| 6,177,303 B1 | 1/2001 | Schmitz | |
| 6,303,418 B1 | 10/2001 | Cha | |
| 6,458,684 B1 | 10/2002 | Guo | |
| 6,573,134 B2 | 6/2003 | Ma | |
| 6,960,416 B2 | 11/2005 | Mui | |
| 7,126,199 B2 | 10/2006 | Doczy | |
| 7,144,783 B2 | 12/2006 | Datta | |
| 7,148,548 B2 | 12/2006 | Doczy | |
| 7,153,784 B2 | 12/2006 | Brask | |
| 7,176,090 B2 | 2/2007 | Brask | |
| 7,186,605 B2 | 3/2007 | Cheng | |
| 7,208,361 B2 | 4/2007 | Shah | |
| 7,217,611 B2 | 5/2007 | Kavalieros | |
| 7,303,949 B2 | 12/2007 | Chen | |
| 7,355,281 B2 | 4/2008 | Brask | |
| 7,381,623 B1* | 6/2008 | Chen et al. | 438/300 |
| 7,407,876 B2 | 8/2008 | Ishizaka | |
| 7,556,998 B2 | 7/2009 | Park | |
| 7,700,479 B2 | 4/2010 | Huang | |
| 8,076,194 B2 | 12/2011 | Tseng | |
| 2006/0024953 A1 | 2/2006 | Papa Rao | |
| 2007/0145591 A1 | 6/2007 | Yano | |
| 2007/0259519 A1 | 11/2007 | Yang | |
| 2007/0262451 A1 | 11/2007 | Rachmady | |
| 2007/0272123 A1 | 11/2007 | Kennedy | |
| 2008/0076216 A1 | 3/2008 | Pae | |
| 2008/0224235 A1 | 9/2008 | Lavoie | |

(Continued)

*Primary Examiner* — Pamela E Perkins
(74) *Attorney, Agent, or Firm* — Justin King; WPAT, PC

(57) ABSTRACT

A method for manufacturing a semiconductor device is provided. A substrate having a first gate and a second gate respectively formed in a first region and a second region is provided. An underlayer is formed on the substrate to cover the first gate in the first region and the second gate in the second region. A patterned mask with a predetermined thickness is formed on the underlayer in the first region. The underlayer corresponding to the second gate in the second region is removed by the patterned mask to expose the second gate, wherein the underlayer corresponding to the first gate in the first region is partially consumed to expose part of the first gate.

19 Claims, 4 Drawing Sheets

(56) References Cited

U.S. PATENT DOCUMENTS

| | | |
|---|---|---|
| 2009/0057769 A1 | 3/2009 | Wei |
| 2009/0186458 A1 | 7/2009 | Yu |
| 2010/0044783 A1 | 2/2010 | Chuang |
| 2010/0065926 A1 | 3/2010 | Yeh |
| 2010/0068877 A1 | 3/2010 | Yeh |
| 2010/0087055 A1* | 4/2010 | Lai et al. ............... 438/585 |
| 2010/0124818 A1 | 5/2010 | Lee |
| 2010/0227445 A1* | 9/2010 | Tseng et al. ............ 438/229 |
| 2010/0244141 A1 | 9/2010 | Beyer |

* cited by examiner

METHOD FOR MANUFACTURING SEMICONDUCTOR DEVICE

BACKGROUND

1. Technical Field

The disclosure relates in general to a method for manufacturing a semiconductor device, and more particularly to the method for manufacturing a semiconductor device having undamaged gates in different regions.

2. Description of the Related Art

In the conventional method for manufacturing the devices on a substrate, part of the devices would be fully covered by the protection layer when other devices are fabricated. For example, the NMOS device is fully covered while the PMOS device is constructed, such as forming the recesses for epitaxially growing the SeGe layer. However, the unprotected gate of the PMOS device may be damaged during fabrication process. In the conventional method, lithography for forming recesses removes portion of the gate in the PMOS region while the gate in the NMOS region is fully protected. Due to the different protection conditions of the devices, the gate heights of the devices are different and the subsequent process would cause damage to the gates (ex: in the PMOS region). The damaged gates have considerable effect on the performance characteristics of the devices.

SUMMARY

The disclosure is directed to a method for manufacturing a semiconductor device, and the device manufactured by the method of the disclosure has undamaged gates in different regions, thereby improving yield and the electrical properties of the device.

According to one embodiment, a method for manufacturing a semiconductor device is provided. A substrate having a first gate and a second gate respectively formed in a first region and a second region is provided. An underlayer is formed on the substrate to cover the first gate in the first region and the second gate in the second region. A patterned mask with a predetermined thickness is formed on the underlayer in the first region. The underlayer corresponding to the second gate in the second region is removed by the patterned mask to expose the second gate, wherein the underlayer corresponding to the first gate in the first region is partially consumed to expose part of the first gate.

Figure 1A:
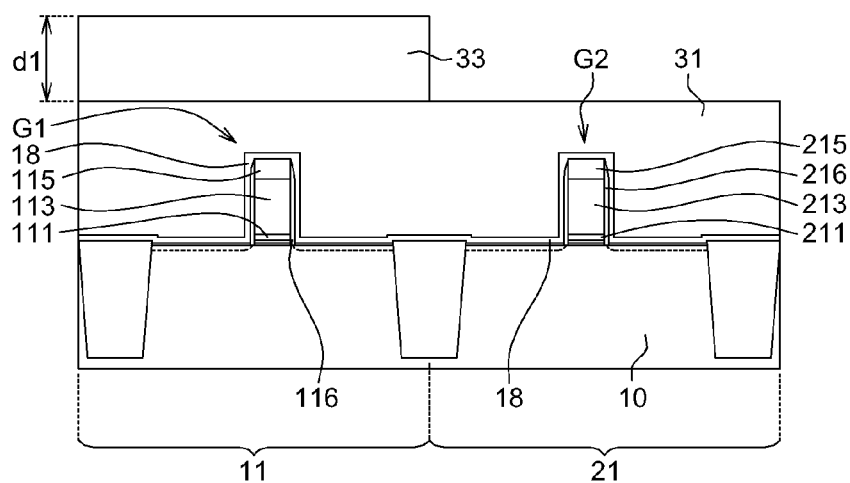
FIG. 1A~FIG. 1G schematically illustrate a method for manufacturing a semiconductor device according to the embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the present disclosure, a method is provided for manufacturing a semiconductor device without damaged gates in the regions of the semiconductor device. Accordingly, the yield and electrical characteristics of the device manufactured using the method of the present disclosure have been greatly improved.

The present disclosure could be applied to a device having different regions (for example, having a NMOS-region and a PMOS-region). The manufacturing method of the embodiment would be slightly different, and could be modified and changed according to the procedures in practical applications. According to the embodiment of the disclosure, a device having different regions, such as a first region (ex: an NMOS-region) and a second region (ex: a PMOS-region), could be manufactured by exposing part of the gate structure in one of the regions while exposing the other gate structure in the other region, thereby preventing the gate structures from being damaged in the subsequent process.

Although the embodiment is provided hereinafter with reference to the accompanying drawings for describing the related procedures, the present disclosure is not limited thereto. It is noted that not all embodiments of the invention are shown. Various embodiments of the manufacturing methods of the disclosure may be embodied in many different forms, and should not be construed as limited to the embodiment set forth herein. Modifications and variations can be made without departing from the spirit of the disclosure to meet the requirements of the practical applications.

FIG. 1A~FIG. 1G schematically illustrate a method for manufacturing a semiconductor device according to the embodiment of the present disclosure. As shown in FIG. 1A, a substrate 10 having a first region 11 and a second region 21 is provided, and a first gate G1 and a second gate G2 are formed in the first region 11 and the second region 21, respectively. In one embodiment, the first region 11 and the second region 21 can be referred to an NMOS-region and a PMOS-region, which are the areas for forming the first gate G1 (ex: an nFET) and the second gate G2 (ex: a pFET). Also, an underlayer 31, such as a layer comprising organic material, is formed on the substrate 10 to cover the first gate G1 in the first region 11 and the second gate G2 in the second region 21.

In one embodiment, the stacked structures are depicted for being the first gate G1 in the first region 11 and the second gate G2 in the second region 21. For example, the first gate G1 comprises a first dielectric layer 111 formed on the substrate 10, a first conductive layer 113 (such as a polysilicon layer) formed on the first dielectric layer 111 and a first cap layer 115 (such as a hardmask layer) formed on the first conductive layer 113. The second gate G2 comprises a second dielectric layer 211 formed on the substrate 10, a second conductive layer 213 (such as polysilicon layer) formed on the second dielectric layer 211, and a second cap layer 215 (such as a hardmask layer) formed on the second conductive layer 213. Also, the spacers 116 are formed at sidewalls of the stacked structure of the first gate G1, and the spacers 216 are formed at sidewalls of the stacked structure of the second gate G2. The first dielectric layer 111 can be a single dielectric layer (ex: oxide layer) as depicted in the drawings, or a multi-dielectric layer including the high-k dielectric film. Similarly, the second dielectric layer 211 can be a single dielectric layer or a multi-dielectric layer.

In one embodiment, a disposal layer 18 is further formed on the substrate 10 and covers the first gate G1 and the second gate G2 blanket for protection. Material of the disposal layer 18 can be nitride, such as silicon nitride (SiN). The disposal layer 18 protects the substrate from being undesired damaged in the subsequent processes.

The epitaxial layer grown in the second region 21 (ex: the PMOS region) is taken for illustrating the method of the embodiment. A mask layer (not shown) is formed on the underlayer 31, and is then patterned to remove the portion corresponding to the second region 21. As shown in FIG. 1A, a patterned mask (such as photo-resist) 33 with a predetermined thickness d1 is formed on the underlayer 31 in the first region 11. The first region 11 will be protected during patterning and growing the epitaxial layer in the second region 21 subsequently.

The thickness d1 of the patterned mask 33 is well calculated by considering the related factors in the subsequent procedures, such as materials of the patterned mask 33 and the underlayer 31, etching way (ex: etching rate and time). Therefore, the thickness d1 of the patterned mask 33 is modified and varied depending on the practical procedures in the applications without departing from the spirit of the disclosure.

Figure 1B:
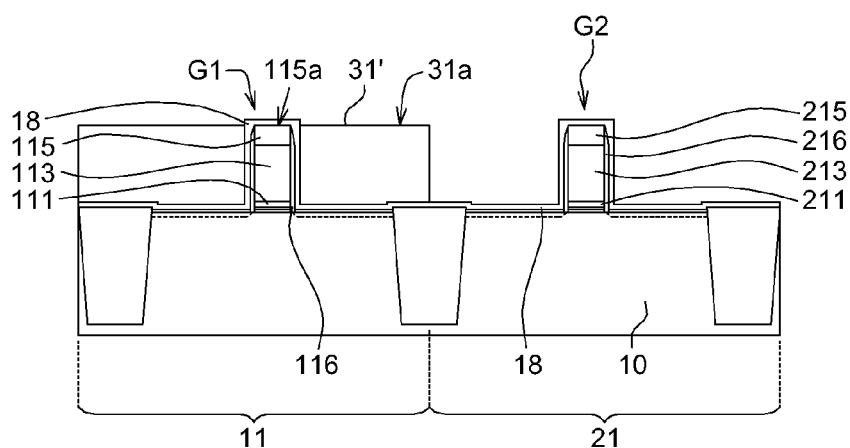

Next, the underlayer 31 corresponding to the second gate G2 in the second region 12 is removed by the patterned mask 33 so as to expose the second gate G2. Meanwhile, the patterned mask 33 is consumed, and the underlayer 31 corresponding to the first gate G1 in the first region 11 is partially consumed to expose part of the first gate G1, as shown in FIG. 1B.

Different exposing conditions may be achieved depending on practical applications. For example, when the underlayer 31 corresponding to the second gate G2 in the second region 21 is removed, a portion of the underlayer 31 substantially above a first cap layer 115 of the first gate G1 is removed, and part of the first gate G1 is exposed. In one embodiment, when the underlayer 31 corresponding to the second gate G2 in the second region 21 is removed, the top surface 31a of the underlayer 31' in the first region 11 is substantially aligned with the top surface 115a of a first cap layer 115 of the first gate G1, and part of the first gate G1 is exposed. In one embodiment, when the underlayer 31 corresponding to the second gate G2 in the second region 21 is removed, the top surface 31a of the underlayer 31' in the first region 11 is lower than the top surface 115a of a first cap layer 115 of the first gate G1. It is noted that the disclosure has not particular limitation thereto. In one embodiment, when the underlayer 31 corresponding to the second gate G2 in the second region 21 is removed, a portion of the disposal layer 18 surrounding a top portion of the first gate G1 is exposed, as shown in FIG. 1B.

Figure 1C:
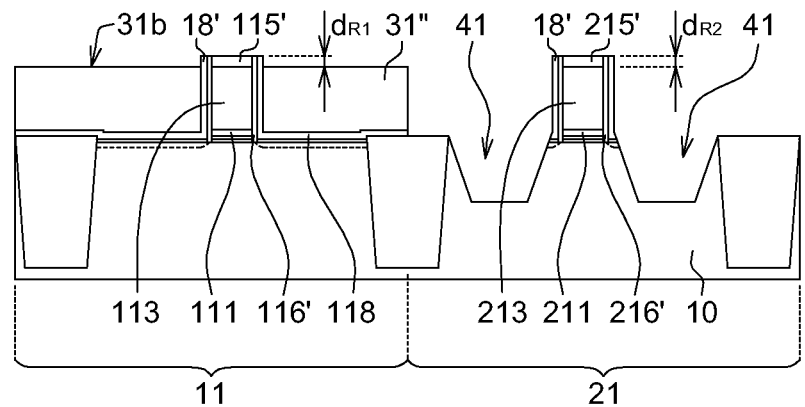

After the underlayer 31 in the second region 21 is removed and the second gate G2 is exposed, a plurality of recesses 41 are formed at the substrate 10 in the second region 21, and those recesses 41 are positioned adjacent the second gate G2, as shown in FIG. 10. Moreover, the first cap layer 115' of the first gate G1 and the second cap layer 215' of the second gate G2 are exposed and consumed simultaneously during formation of the recesses 41. According to the embodiment, the remained thickness $d_{R1}$ of the first cap layer 115' and the remained thickness $d_{R2}$ of the second cap layer 215' are substantially the same, or almost equal. Meanwhile, the underlayer 31' in the first region 11 is also consumed during formation of the recesses 41 (therefore the top surface 31b of FIG. 1C is lower than the top surface 31a of FIG. 1B), and the exposed first cap layer 115' and second cap layer 215' are higher than the top surface 31b of the underlayer 31", as illustrated in FIG. 1C.

Figure 1D:
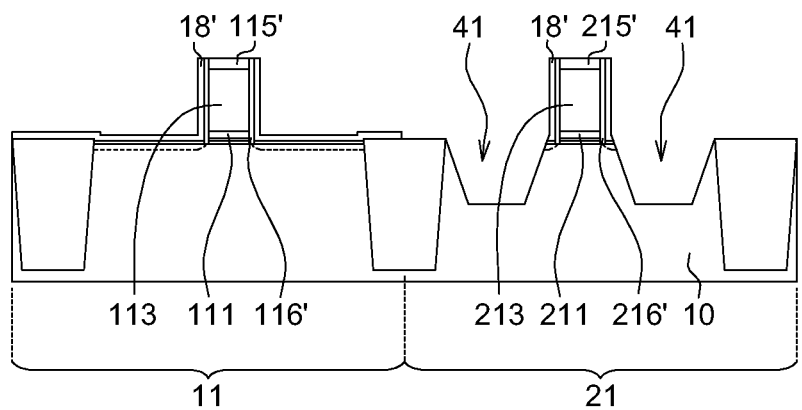

After forming the recesses 41 at the substrate 10 in the second region 21, the underlayer 31" in the first region 11 is removed, as shown in FIG. 1D. The substrate 10 in the first region 11 is still protected under a blanket of the disposal layer 18.

Figure 1E:
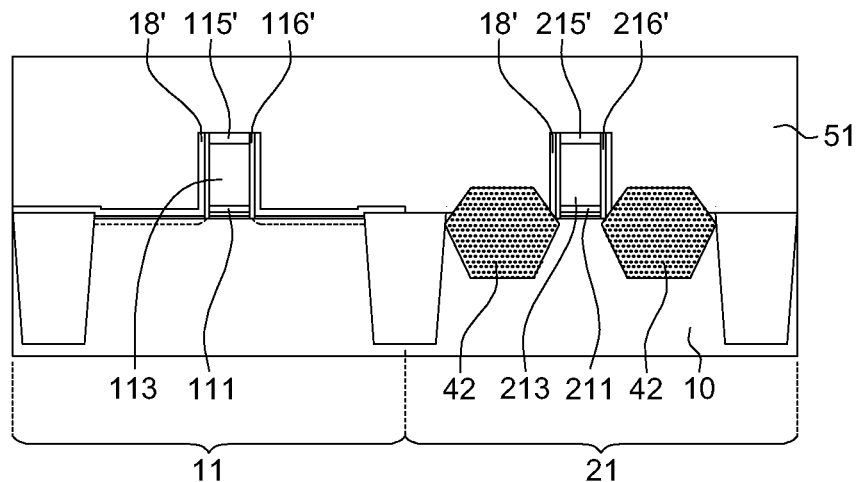
Figure 1F:
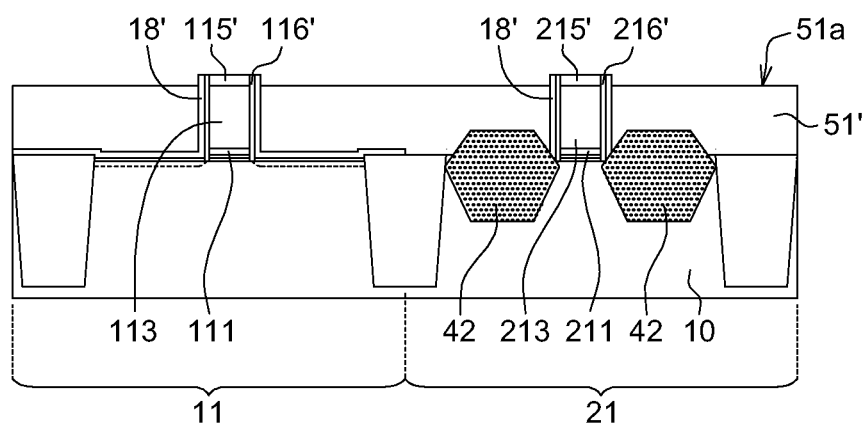

Then, an epitaxial layer 42 is grown at the recesses 41 of the second region 21, and a planarization layer 51 is formed on the substrate 10 to cover the first gate G1 and the second gate G2, as shown in FIG. 1E. In one embodiment, the epitaxial layer is a highly compressive selective epitaxial SiGe layer. The planarization layer 51 can be, but not limited to, a layer comprising organic material.

The planarization layer 51 is partially removed to expose the remained first cap layer 115' of the first gate 01 and the remained second cap layer 215' of the second gate G2. The planarization layer 51 can be partially removed by etching back for exposing the remained first cap layer 115' and the remained second cap layer 215'. As shown in FIG. 1 F, the top surface 51a of the planarization layer 51' is lower than the top surfaces of the remained first cap layer 115' and the remained second cap layer 215' according to one embodiment of the disclosure.

Figure 1G:
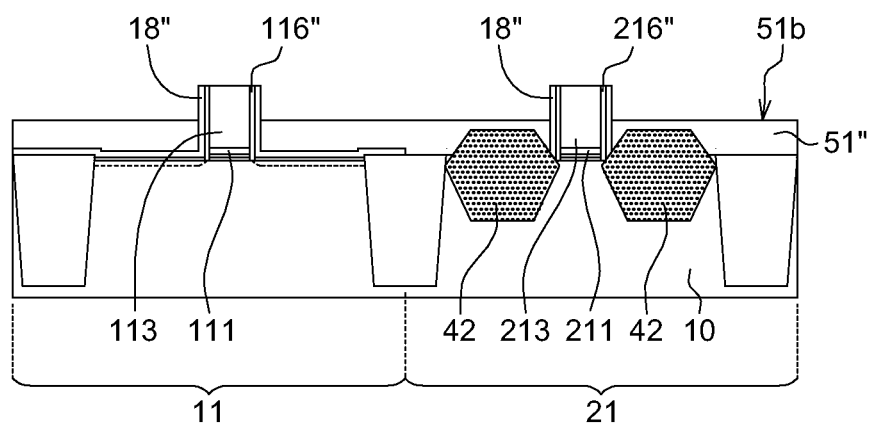

As shown in FIG. 1G, the remained first cap layer 115' of the first gate G1 and the remained second cap layer 215' of the second gate G2 are removed; for example, by dry etching. Removal of the cap layers can be accomplished by means of an adequate method, and the removing method could be varied according to the related factors in the practical applications, such as material characteristics of the first cap layer 115 and the second cap layer 215.

The present invention could be applied to manufacture a semiconductor device having no-damaged gates in the different regions; for example, the gate of a PMOS of the semiconductor device is free of damage.

According to the aforementioned descriptions, a method for manufacturing a semiconductor device is provided for protecting the gates from being damaged, especially, the second gate G2 in the second region 21 as described above. In the method of the embodiment, the thickness d1 of the patterned mask 33 is well calculated, and the remained thickness $d_{R1}$ of the first cap layer 115' and the remained thickness $d_{R2}$ of the second cap layer 215' are substantially the same or almost equal after formation of the recesses 41 are accomplished, thereby providing a similar condition/configuration of the gates in the different regions, which facilitates controlling the subsequent processing steps, and the gates in different regions are free of damage consequently. Thus, the yield and electrical characteristics of the device manufactured using the method of the present disclosure are greatly improved.

Although an NMOS-region and a PMOS-region are described for illustrating the embodiment above, it is noted that the present disclosure is not limited thereto. In practical application, the first region could be a PMOS region and the second region could be an NMOS region for the implementation. Also, other embodiments with different configurations of the first and second gates and the epitaxial layer are also applicable, which could be varied depending on the actual needs of the applications. It is, of course, noted that the configurations of FIG. 1A-FIG. 1G are depicted only for demonstration, not for limitation. It is known by people skilled in the art that the steps of method could be adjusted according to the requirements and/or manufacturing methods of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
   providing a substrate having a first gate and a second gate respectively formed in a first region and a second region;
   forming an underlayer on the substrate to cover the first gate in the first region and the second gate in the second region;
   forming a patterned mask with a predetermined thickness on the underlayer in the first region; and
   removing the underlayer corresponding to the second gate in the second region by the patterned mask to expose the second gate, wherein the underlayer corresponding to the first gate in the first region is partially consumed to expose part of the first gate, a top surface of the underlayer remained in the first region has substantially equal height for forming a flat plane, and the top surface of the underlayer remained in the first region is lower than a top surface of the first gate.

2. The method according to claim 1, after removing the underlayer in the second region to expose the second gate, the method further comprising:
   forming a plurality of recesses at the substrate adjacent the second gate in the second region, wherein a first cap layer of the first gate and a second cap layer of the second gate are exposed and consumed simultaneously during formation of the recesses, and a remained thickness of the first cap layer and a remained thickness of the second cap layer are substantially the same.

3. The method according to claim 2, wherein the first cap layer of the first gate and the second cap layer of the second gate are consumed simultaneously, and the exposed first and second cap layers are higher than the top surface of the underlayer.

4. The method according to claim 2, after forming the recesses at the substrate adjacent the second gate in the second region, the method further comprising:
   removing the underlayer in the first region; and
   growing an epitaxial layer at the recesses.

5. The method according to claim 4, after removing the underlayer in the first region, the method further comprising:
   removing the first cap layer of the first gate and the second cap layer of the second gate.

6. The method according to claim 5, wherein the first cap layer and the second cap layer are removed by dry etching.

7. The method according to claim 4, after removing the underlayer in the first region, the method further comprising:
   forming a planarization layer on the substrate to cover the first gate and the second gate;
   partially removing the planarization layer to expose the first cap layer of the first gate and the second cap layer of the second gate; and
   removing the first cap layer of the first gate and the second cap layer of the second gate.

8. The method according to claim 7, wherein the planarization layer is etched back to expose the first and the second cap layers.

9. The method according to claim 1, wherein when the underlayer corresponding to the second gate in the second region is removed, a portion of the underlayer substantially above a first cap layer of the first gate is removed.

10. The method according to claim 1, wherein when the underlayer corresponding to the second gate in the second region is removed, the top surface of the underlayer in the first region is substantially aligned with a top surface of a first cap layer of the first gate.

11. The method according to claim 1, wherein when the underlayer corresponding to the second gate in the second region is removed, the top surface of the underlayer in the first region is lower than a top surface of a first cap layer of the first gate.

12. The method according to claim 1, wherein a disposal layer is formed on the substrate and covers the first gate and the second gate.

13. The method according to claim 12, wherein when the underlayer corresponding to the second gate in the second region is removed, a portion of the disposal layer surrounding a top portion of the first gate is exposed.

14. The method according to claim 1, wherein a first gate comprises:
   a first dielectric layer formed on the substrate;
   a first conductive layer formed on the first dielectric layer; and
   a first cap layer formed on the first conductive layer.

15. The method according to claim 14, wherein the first dielectric layer is a single dielectric layer or a multi-dielectric layer, the first conductive layer is a polysilicon layer, and the first cap layer is a hardmask layer.

16. The method according to claim 1, wherein a second gate in the second region comprises:
   a second dielectric layer formed on the substrate;
   a second conductive layer formed on the second dielectric layer; and
   a second cap layer formed on the second conductive layer.

17. The method according to claim 16, wherein the second dielectric layer is a single dielectric layer or a multi-dielectric layer, the second conductive layer is a polysilicon layer, and the second cap layer is a hardmask layer.

18. The method according to claim 1, wherein the first region is an NMOS region, and the second region is a PMOS region.

19. The method according to claim 1, wherein the first region is a PMOS region, and the second region is an NMOS region.

* * * * *